United States Patent [19]

Sato et al.

[11] Patent Number: 5,608,218
[45] Date of Patent: Mar. 4, 1997

[54] SCANNING ELECTRON MICROSCOPE

[75] Inventors: Mitsugu Sato, Katsuta; Yoichi Ose, Mito; Satoru Fukuhara, Katsuta; Hideo Todokoro, Tokyo; Makoto Ezumi, Katsuta, all of Japan

[73] Assignee: Hitachi, Ltd., Tokyo, Japan

[21] Appl. No.: 359,761

[22] Filed: Dec. 20, 1994

[30] Foreign Application Priority Data

Dec. 28, 1993 [JP] Japan ................................. 5-334894

[51] Int. Cl.⁶ .................................................. H01J 37/244
[52] U.S. Cl. ................................................................ 250/310
[58] Field of Search ................................. 250/306, 310, 250/397

[56] References Cited

U.S. PATENT DOCUMENTS

| | | | |
|---|---|---|---|
| 4,041,311 | 8/1977 | Martin | 250/310 |
| 4,308,457 | 12/1981 | Reimer | 250/311 |
| 4,769,543 | 9/1988 | Plies | 250/310 |
| 4,772,847 | 9/1988 | Todokoro | 250/310 |
| 4,812,651 | 3/1989 | Feuerbaum et al. | 250/310 |
| 4,897,545 | 1/1990 | Danilatos | 250/310 |
| 4,933,552 | 6/1990 | Lee | 250/310 |
| 5,097,127 | 3/1992 | Hildenbrand et al. | 250/310 |
| 5,182,454 | 1/1993 | Matsuda et al. | 250/310 |
| 5,191,213 | 3/1993 | Ahmed et al. | 250/310 |
| 5,212,383 | 5/1993 | Scharf | 250/310 |
| 5,412,210 | 5/1995 | Todokoro et al. | 250/310 |

*Primary Examiner*—Bruce C. Anderson
*Attorney, Agent, or Firm*—Kenyon & Kenyon

[57] ABSTRACT

A scanning electron microscope suitable for producing an image of high resolution by detecting secondary electrons and backscattered electrons generated from a specimen at a low accelerating voltage in a separate or synthesis fashion. In the scanning electron microscope electric and magnetic fields for separating trajectories of backscattered electrons and secondary electrons generated from a specimen are established, and a backscattered electron detector for detecting generated backscattered electrons is disposed on the trajectory of the backscattered electrons. According to the microscope, since secondary electrons and backscattered electrons can be detected efficiently in a separate fashion even at a low accelerating voltage of several kilovolts or less and besides the detector does not exert the deflection action on a primary electron beam, backscattered and secondary electron images of high resolution can be obtained.

22 Claims, 7 Drawing Sheets

MAGNIFICATION : X 70,000
ACCELERATION VOLTAGE : 0.8 KV

FIG. 5C

MAGNIFICATION : X 70,000
ACCELERATION VOLTAGE : 0.8 KV

FIG. 6B

MAGNIFICATION : X 50,000
ACCELERATION VOLTAGE : 0.8 KV

FIG. 6C

MAGNIFICATION : X 50,000
ACCELERATION VOLTAGE : 0.8 KV

SCANNING ELECTRON MICROSCOPE

BACKGROUND OF THE INVENTION

The present invention relates to an electron beam apparatus and more particularly to a scanning electron microscope suitable for obtaining a high resolution image by detecting backscattered electrons generated from a specimen.

Conventionally, in the scanning electron microscope, a detector (semiconductor or scintillator) different from a secondary electron detector is disposed above a specimen (on the side of an electron source) to detect backscattered electrons. The conventional detector is, however, disadvantageous in that when the accelerating voltage for primary electrons is reduced to a low accelerating voltage of several kilovolts or less, sufficient sensitivity cannot be obtained because energy of backscattered electrons generated from the specimen is comparable to that of primary electrons. This is because a method in which a predetermined voltage is applied to the surface for detection of backscattered electrons to accelerate and detect the backscattered electrons is employed as a method for detection of backscattered electrons at low acceleration. However, in this method secondary electrons are also accelerated concurrently and highly efficient separate detection of backscattered electrons and secondary electrons at low accelerating voltage faces difficulties in principle. Further, because of disposition of the backscattered electron detector on the optical axis, the backscattered electron detector must have a shape which permits the primary electron beam to transmit through the detector and detection of backscattered electrons in a region through which the primary electron beam transmits is impossible in principle.

Further, the conventional scanning electron microscope does not have the function to accurately separate and detect backscattered electrons and secondary electrons generated from the same specimen object and therefore it cannot construct a specimen image due to backscattered electron signal or secondary electron signal and display a specimen image as a result of synthesis of backscattered electron signal or secondary electron signal.

Further, in the conventional scanning electron microscope, the backscattered electron detector must be interposed between the objective lens and the specimen to cause the distance between the objective lens and the specimen to be broadened and hence even when a primary electron beam is desired to be focused for irradiation on the specimen, a condensed beam is broadened by an amount corresponding to the distance between the objective lens and the specimen and the resolution is degraded even if a specimen image is formed by backscattered electrons generated from the specimen.

SUMMARY OF THE INVENTION

The present invention eliminates the aforementioned drawbacks of the prior art and provides a scanning electron microscope which can separate secondary electrons and backscattered electrons even at a low accelerating voltage of several kilovolts or less without affecting a trajectory of a primary electron beam to detect a backscattered electron signal with high efficiency.

The present invention provides a scanning electron microscope which can produce a specimen image due to backscattered electrons generated from a specimen by detecting the backscattered electrons in synchronism with scanning of the specimen with primary electrons.

It is further intended that backscattered electrons from a specimen can be detected accurately even when a detector for detecting backscattered electrons is disposed between an objective lens and an electron source, so that the distance between the specimen and the objective lens can be set to be as small as possible.

To accomplish the above object, in a scanning electron microscope according to an embodiment of the present invention, electric and magnetic fields for separating trajectories of backscattered electrons and secondary electrons generated from a specimen are established, and a backscattered electron detector for detecting backscattered electrons is disposed on the trajectory of the backscattered electrons.

To accomplish another object as above, in a scanning electron microscope of the present invention, a backscattered electron detector for detecting backscattered electrons generated from the specimen is disposed on a trajectory of the backscattered electrons, and backscattered electrons from the specimen are detected in synchronism with scanning of the specimen with the primary electron beam to construct an image of the specimen due to the backscattered electrons.

Further, to accomplish another object as above, in a scanning electron microscope of the present invention, electric and magnetic fields for separating trajectories of backscattered electrons and secondary electrons generated from a specimen are established on an optical system between an electron source and the specimen and a backscattered electron detector for detecting backscattered electrons is disposed on the side of the electron source as viewed from the objective lens.

According to the above-described embodiments of the present invention, the following operations are fulfiled.

More particularly, since electric and magnetic fields for separating the trajectories of backscattered and secondary electrons generated from a specimen are established on the optical system between the electron source and the specimen, backscattered electrons and secondary electrons traveling from the specimen toward the electron source trace different trajectories and the detector for detecting only backscattered electrons can be disposed at a position at which backscattered electrons separating from secondary electrons can arrive.

Further, since the backscattered electron detector for detecting only backscattered electrons can be disposed on the trajectory of backscattered electrons generated from the specimen, a signal representative of backscattered electrons from the specimen can be obtained in synchronism with scanning of the specimen with the primary electron beam to construct a specimen image due to the backscattered electrons.

Further, since backscattered electrons can be detected even when the backscattered electron detector is disposed on the side of the electron source as viewed from the objective lens, the distance between the objective lens and the specimen can be as small as possible and the primary electron beam can be focused into a fine spot for irradiation on the specimen

BRIEF DESCRIPTION OF THE DRAWINGS

These and other objects and technical advantages of the present invention will be readily apparent from the following descriptions of the preferred exemplary embodiment(s)

of the present invention in conjunction with the accompanying drawings, in which.

DESCRIPTION OF THE PREFERRED EMBODIMENTS

Figure 1:
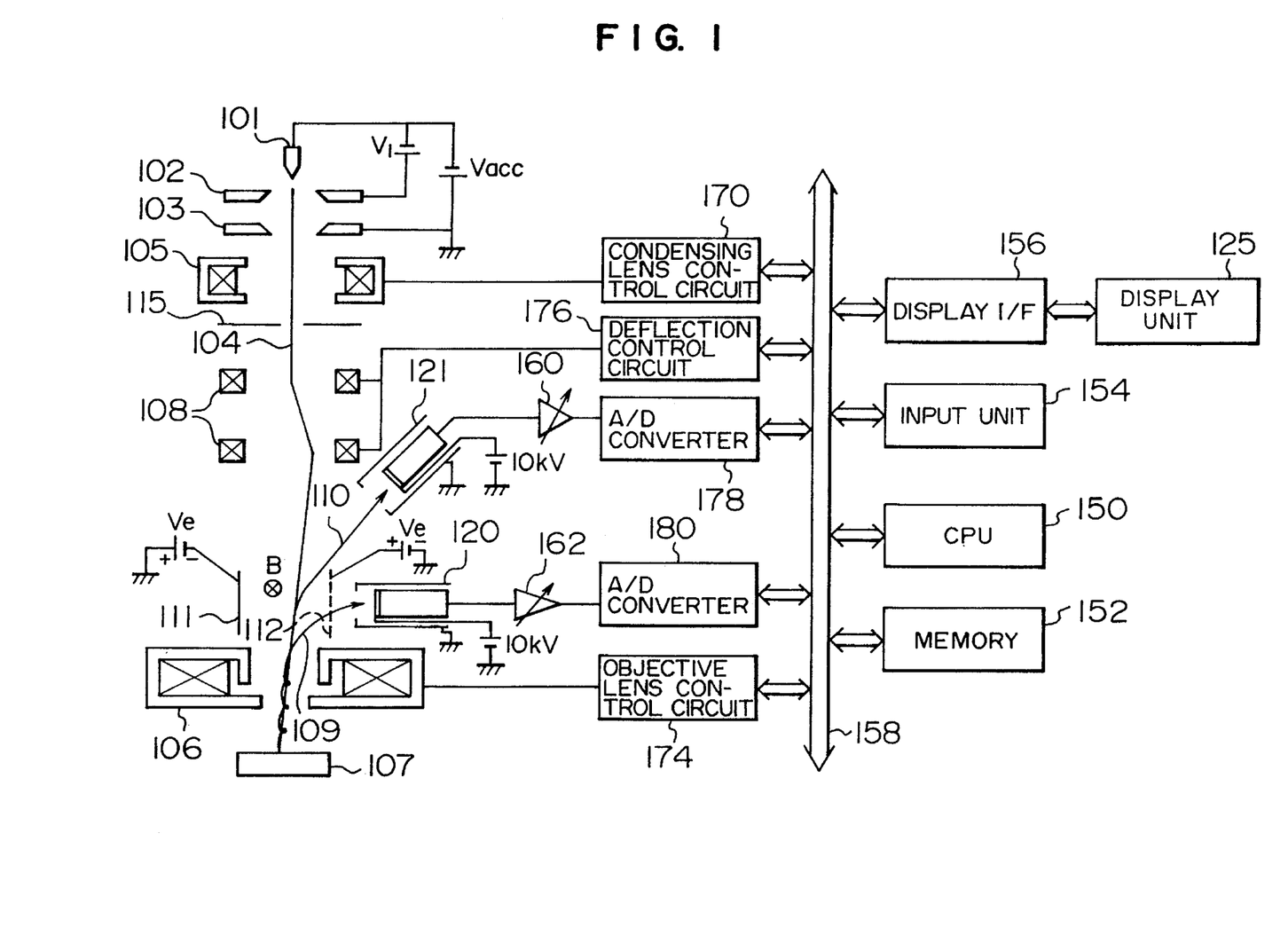
FIG. 1 shows an embodiment of the present invention.

FIG. 1 is a diagram showing a scanning electron microscope according to an embodiment of the present invention.

A primary electron beam 104 emitted from a cathode 101 by voltage V1 applied between the cathode 101 and a first anode 102 is accelerated by voltage Vacc applied to a second anode 103 so as to travel to an optical system of succeeding stage. The primary electron beam 104 is focused to a fine spot on a specimen 107 by means of a condensing lens 105 controlled by a condensing lens control circuit 170 and an objective lens 106 controlled by an objective lens control circuit 174 and is scanned two-dimensionally on the specimen by means of two stages of deflection coil 108. A scanning signal for the deflection coil 108 is controlled by a CPU 150 through a deflection control circuit 176 in accordance with an observation magnification designated by an input unit 154.

Figure 2:
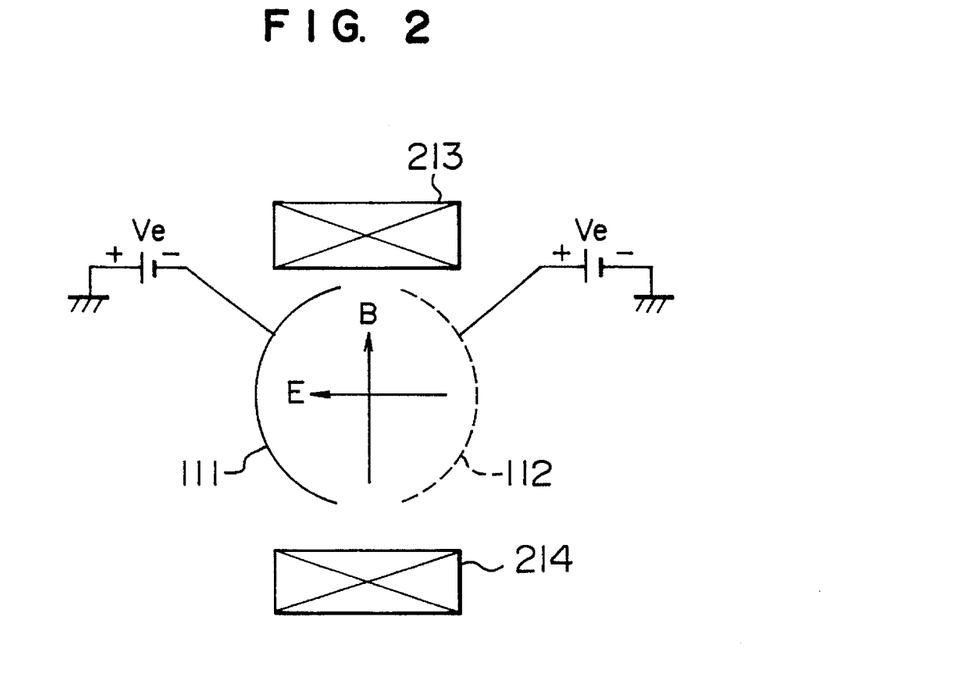
FIG. 2 is a diagram showing the planar construction of a generator of orthogonal electric and magnetic fields in an embodiment of the present invention.

Structurally, in an embodiment of the present invention, there are arranged along the optical axis a porous electrode 112 through which secondary electrons 109 can transmit, an opposing electrode 111 and coils 213 and 214 for magnetic field generation as shown in FIG. 2 adapted to generate a magnetic field B which is substantially orthogonal to an electric field E generated by the electrodes in order that a trajectory of the secondary electrons 109 is separated from that of backscattered electrons 110, and a secondary electron detector 120 is disposed at a position viewing the trajectory of the secondary electrons 109 which have been separated and transmitted through the porous electrode 112 and a backscattered electron detector 121 is disposed at a position viewing the trajectory of the backscattered electrons which have been separated from the secondary electrons so that both types of electrons may be detected separately.

With this construction, the primary electron beam 104 receives a force for deflecting it in the same direction as the electric field E generated by the porous electrode 112 and opposing electrode 111. On the other hand, since the magnetic field B orthogonal to the electric field E is generated by means of the crossed magnetic field generation coils 213 and 214, the primary electron beam 104 is affected by a Lorentz force to receive a force in a direction orthogonal to both the magnetic field B and the optical axis (travel direction of the primary electron beam), that is, on a straight line having the same orientation as the electric field E. Accordingly, by selecting the polarity and intensity of the magnetic field B suitably, curving of the trajectory of the primary electron beam due to the electric field E can be canceled out completely by the magnetic field B. Further, since the electric field E and magnetic field B are substantially uniform near the optical axis, astigmatism or the like due to non-uniform distribution of electric and magnetic fields does not occur and the primary electron beam ultimately comes in the objective lens 106 without receiving any action.

Secondary electrons 109 and backscattered electrons 110 are discharged from a primary electron beam irradiating point on the specimen 107. The secondary electrons 109 travel upwards while performing helical motion under the influence of the magnetic field of the objective lens 106 and are strongly deflected by the action of the electric field E generated by the porous electrode 112 and opposing electrode 111 and the magnetic field B generated by the crossed magnetic field generation coils 213 and 214, so that the secondary electrons transmit through the porous electrode 112 and are captured by the secondary electron detector 120. The backscattered electrons 110 having higher energy, on the other hand, are not so deflected as to transmit through the porous electrode even under the action of the orthogonal electric and magnetic fields and travel further upwards with their trajectory curved slightly. But, the detector 121 is disposed at the position viewing the backscattered electron trajectory and hence the backscattered electrons are captured by the backscattered electron detector 121.

A signal from the backscattered electron detector 121 is inputted to a variable amplifier 160, a signal from the secondary electron detector 120 is inputted to a variable amplifier 162 and the respective signals are amplified at a desired gain inclusive of zero and thereafter converted by A/D converters 178 and 180 into digital signals which are in turn inputted to a data bus 158. These signals are then subjected to signal processings by the CPU 150 and data signals before or after the signal processings are stored in storage means 152 such as a memory. The CPU 150 uses the signals of backscattered electrons or secondary electrons stored in the storage means 152 or the processed signals to display a backscattered electron image or a secondary electron image of the specimen or an enlarged specimen image due to a processed signal on a display unit 125 such as a CRT through an interface 156. Even without the intervening storage means, the CPU can also have the function to display a specimen image in a real time fashion during scanning of the specimen 107.

While accelerating voltage, intensity of capture electric field and current value have been described as being fixed in the above embodiment, the CPU 150 can responds to a designation from the input unit 154 to have the function to make variable the value of accelerating voltage Vacc, the intensity of capture electric fields of the backscattered and secondary electron detectors and the current values for the condensing and objective lenses.

Figure 3:
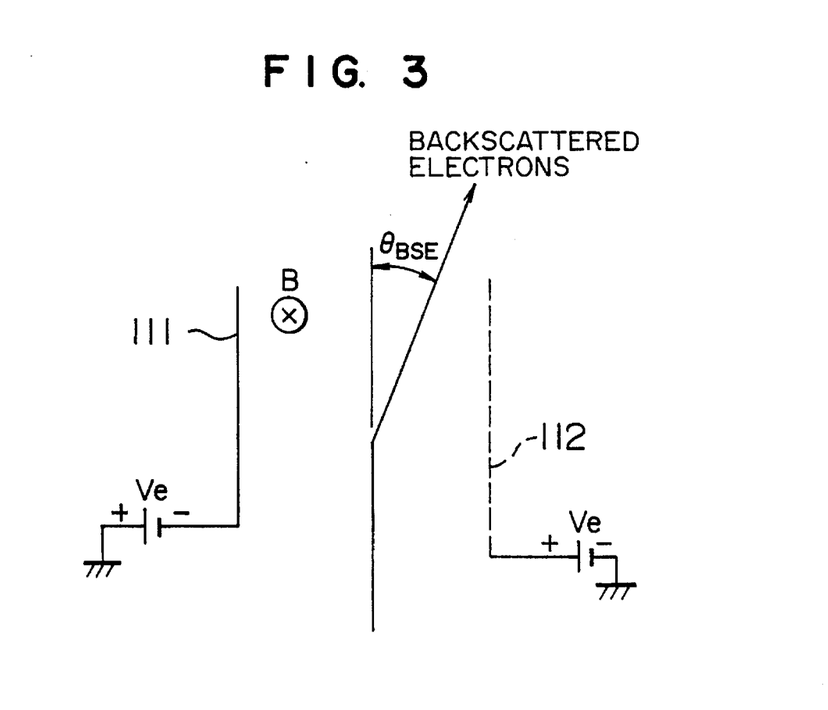
FIG. 3 is a diagram for explaining a backscattered electron beam in an embodiment of the present invention.

FIGS. 2 and 3 show an embodiment of the electric and magnetic fields in the scanning electron microscope of the present invention in greater detail.

When a potential difference of ±Ve (V) is applied between the porous electrode 112 and the opposing electrode 111 to generate an electric field E, a primary electron beam 104 at accelerating voltage Vacc is deflected by an angle θe=Ke·Ve/Vacc proportional to Ve/Vacc, where Ke is a constant determined by the shape and disposition of the porous electrode 112 and opposing electrode 111.

On the other hand, when exciting current Ib (A) is passed through the crossed magnetic field generation coils 213 and 214, a magnetic field B orthogonal to the electric field E is generated and the primary electron beam 104 is deflected by an angle θb=kb·Ib/√Vacc proportional to Ib/√Vacc in a direction opposite to the deflection by the electric field, where Kb is a constant determined by the shape and disposition of the crossed magnetic field generation coils 213 and 214. In the case where the mutually orthogonal electric field E and magnetic field B exist at a time, the trajectory of the primary electron beam is determined by a resultant force due to the electric field E and magnetic field B and therefore, if θc=θb is chosen, then the primary electron beam will travel straight-forwardly without receiving the deflection action.

On the other hand, secondary electrons 109 and backscattered electrons 110 generated from the specimen 107 travel in a direction opposite to the travel direction of the primary electrons 104 and hence they are deflected by the electric and magnetic fields to the same orientation, that is, toward the porous electrode. Accordingly, if θe and θb are kept to be constant, the backscattered electrons having substantially the same energy as the primary electrons are always deflected by a constant angle toward the porous electrode.

At that time, since the backscattered electrons generated from the specimen have substantially the same energy as the primary electrons, an angle $θ_{BSE}$ as shown in FIG. 3 by which the backscattered electrons are deflected by the orthogonal electric and magnetic fields is given by $θ_{BSE}$=θc+θb.

Accordingly, the intention can be accomplished by setting the voltage Ve applied across the electrodes and the exciting current Ib(A) passed through the coils such that the condition for the primary electrons not to be deflected, that is θc=θb and the condition for the deflection angle $θ_{BsE}$ of the backscattered electrons to be constant, that is, $θ_{BSE}$=θc+θb=constant are both satisfied. From the above, the relation between voltage Ve and current Ib can be determined as follows:

$Ve = K · Vacc$ $Ib = K · (Ke/Kb) · \sqrt{Vacc}$ where K is a constant for determining the deflection angle $θ_{BSE}$ of backscattered electrons.

The secondary electrons have very low energy and hence they are deflected intensely by the orthogonal electric and magnetic fields so as to transmit through the porous electrode 112. Accordingly, by disposing the electron detectors at the position viewing the trajectory of the backscattered electrons and at the position viewing the porous electrode, respectively, the backscattered electrons and the secondary electrons can be detected separately.

Figure 4:
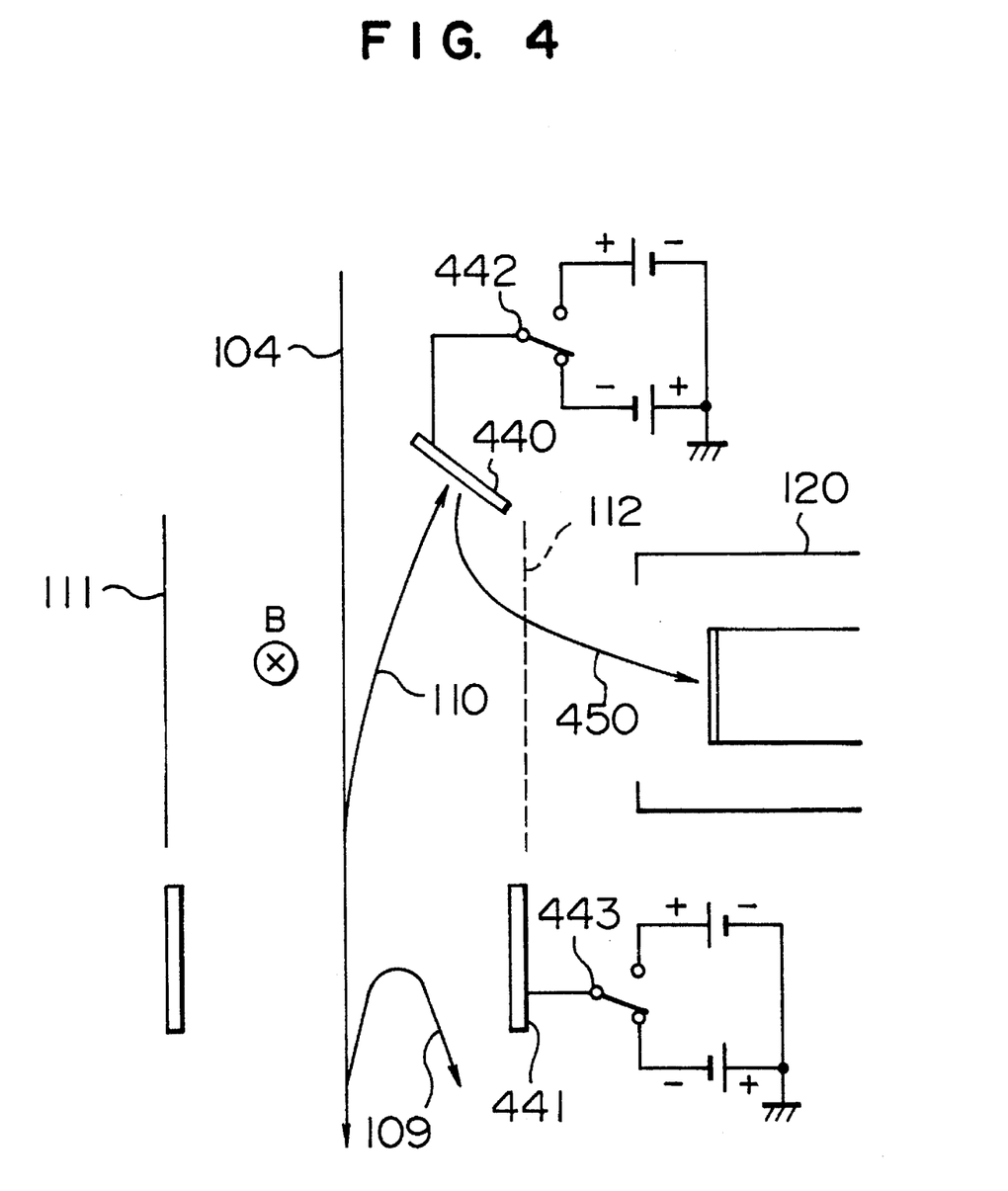
FIG. 4 shows another embodiment of the present invention.

FIG. 4 shows another embodiment of the separate detection of secondary electrons and backscattered electrons.

In the embodiment of the present invention shown in FIG. 4, a secondary electron conversion electrode 440 for converting backscattered electrons into secondary electrons is disposed on the trajectory of backscattered electrons separated from secondary electrons and when earth or negative voltage is applied to this electrode, the backscattered electrons impinge on the electrode to generate secondary electrons of low energy from the electrode surface. The intensity of the orthogonal electric and magnetic fields is so set as not to exert the deflection action on the primary electron beam 104 but secondary electrons 450 having lower energy than the primary electrons are curved more intensely by the electric field than by the magnetic field. As a result, the secondary electrons are deflected intensely toward the porous electrode 112 to transmit therethrough and detected by the detector disposed at the position viewing the porous electrode. When an axis-symmetrical electrode 441 is disposed beneath the porous electrode 112 and a suitable negative voltage is applied thereto, secondary electrons generated from the specimen are prevented by the axis-symmetrical electrode from traveling theretoward so as to be bounced toward the specimen and only the backscattered electrons of higher energy can be converted into the secondary electrons 450 at the conversion electrode 440 disposed above the porous electrode. The thus converted secondary electrons 450 reflect backscattered electron information from the specimen and therefore, forming an image from this signal becomes equivalent to forming an image from a backscattered electron signal from the specimen.

As is clear from FIG. 4, the secondary electrons or the backscattered electrons can be selected for detection or the secondary electrons and the backscattered electrons can be synthesized for detection in accordance with combinations of the polarities of voltages applied to the secondary electron conversion electrode 440 and axis-symmetrical electrode 441 beneath the porous electrode.

For example, positive or negative voltage can be applied to the secondary electron conversion electrode 440 through a transfer switch 442 and the axis-symmetrical electrode 441 is disposed beneath (close to the specimen) the porous electrode 112 and can be applied with positive or negative voltage through a transfer switch 443. When a suitable negative voltage is applied to the electrode 440, the backscattered electrons 110 impinging on the electrode 440 cause secondary electrons 450 to be discharged from the electrode surface. With a suitable positive voltage to the electrode 440, secondary electrons are suppressed by the potential at the electrode 440 and will not be discharged from the electrode 440 even when the backscattered electrons impinge on the electrode. On the other hand, with a suitable positive voltage applied to the electrode 441, the secondary electrons 109 generated from the specimen are allowed to travel to the porous electrode but with a suitable negative voltage applied, the secondary electrons are not allowed to pass by the electrode 441 and are bounced toward the specimen. Accordingly, by switching the polarity of voltages applied to the electrodes 440 and 441, the detector 120 can detect the secondary electrons 109 and the backscattered electrons 110 selectively or both the secondary electrons 109 and the backscattered electrons 110 simultaneously; and the detected signals can be displayed as images on the display unit 125 comprised of a CRT as in the case of the previously-described FIG. 1 embodiment.

FIGS. 5A–5C and 6A–6C show pictures displayed when an example of a specimen is measured with the scanning electron microscope of the present invention.

Figure 5A:
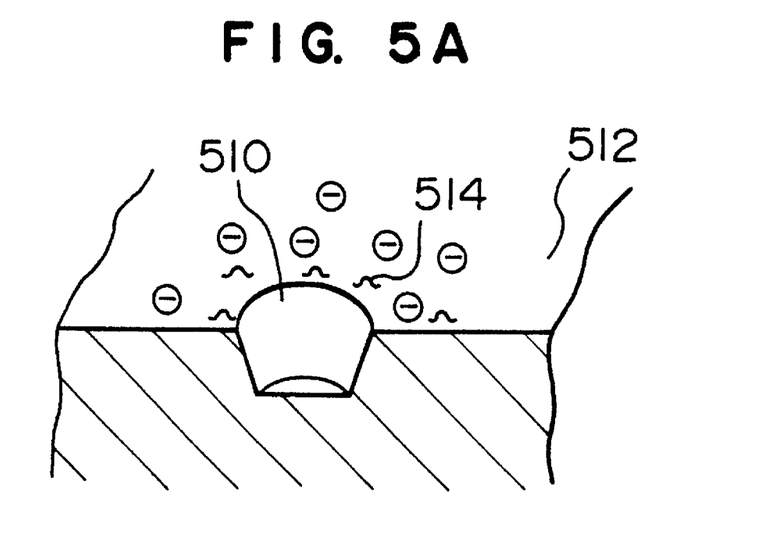
FIG. 5A is a diagram showing a schematic shape of an object to be measured.
Figure 5B:
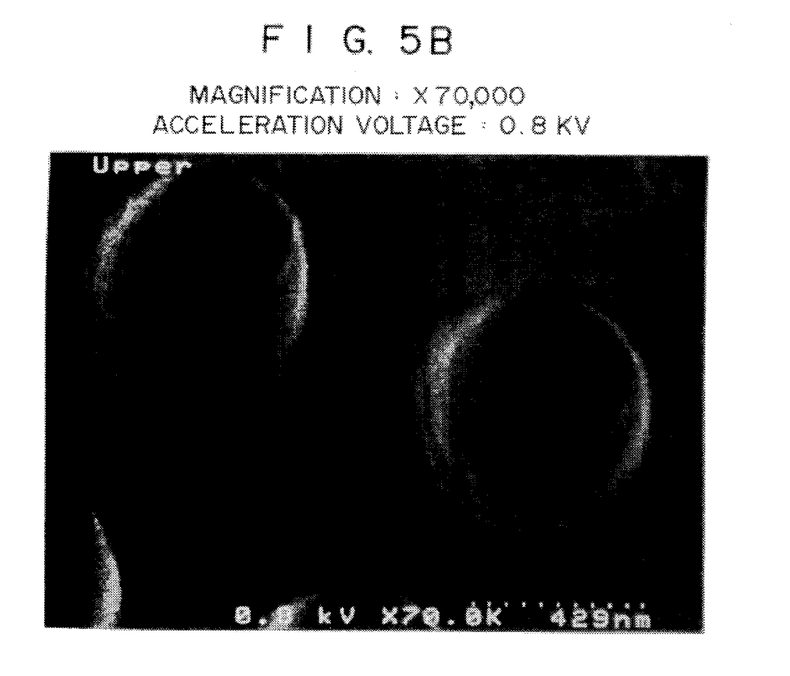
FIG. 5B shows an image obtained when the object is scanned with secondary electrons.
Figure 5C:
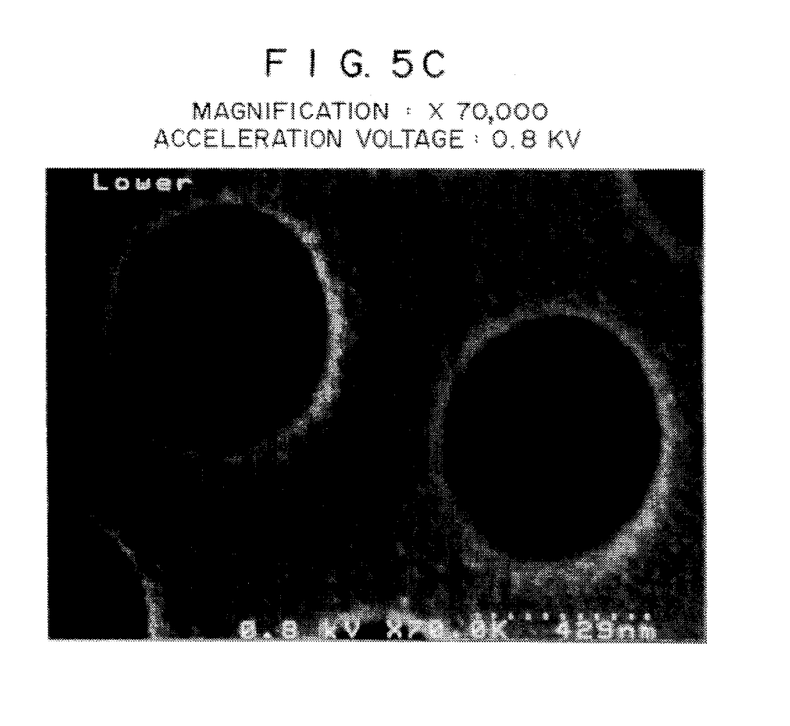
FIG. 5C shows an image obtained when the object is scanned with backscattered electrons.

FIG. 5A–5C show an embodiment wherein a contact hole 510 in a photoresist 512 formed on a semiconductor substrate (silicon oxide) is measured.

FIG. 5A shows a schematic shape of an object to be measured, indicating a state in which an undulatory portion 514 is present near an opening of the contact hole and the specimen surface is charged up negatively near the opening.

FIG. 5B shows an image obtained when the contact hole is scanned with secondary electrons from the direction of the opening, indicating that accurate image information of the wall surface and bottom portions of the contact hole which are not charged up can be obtained but accurate image state of a specimen opening nearby portion which is charged up cannot be obtained.

FIG. 5C shows a specimen surface image based on a backscattered electron signal obtained when the specimen is scanned with primary electrons, indicating that an image of the bottom portion of the contact hole cannot be obtained but an accurate undulatory state near the specimen opening can be obtained.

Typically, a secondary electron signal generated when the specimen is scanned with primary electrons is based on electrons discharge from the surface of the specimen and having low energy (about several electron volts), which electrons are not affected by scattering of an electron beam in the specimen and reflect, with high fidelity, a topographic state of the specimen, and the secondary electron signal features the ability to provide information of high spatial resolution.

However, in a conventional analysis method based on the secondary electron signal, if the specimen surface is charged up negatively (hereinafter expressed by charge-up), the ascent of secondary electrons is prevented by the charge-up, giving rise to a phenomenon that the secondary electron signal cannot reflect, with high fidelity, the undulatory portion near the contact hole opening, that is, the topographic state of the specimen surface, and the specimen image of FIG. 5B demonstrates that accurate image information of the charged-up specimen opening nearby portion cannot be obtained owing to this phenomenon.

Contrary to this, the specimen image shown in FIG. 5C is due to backscattered electrons, demonstrating that an accurate undulatory state near the specimen opening, which cannot be obtained with the secondary electrons, can be known.

The reason why an accurate specimen image can be detected with backscattered electrons in the scanning electron microscope of the present invention will be described hereunder.

In a conventional backscattered electron detecting method, a specimen is scanned with primary electrons of high energy accelerated at a high voltage, with the result that the primary electrons penetrate deeply into the specimen and backscattered electrons of high energy (substantially the same energy as the accelerating voltage) are generated at a corresponding depth in the specimen. Accordingly, under the influence of scattering of the primary electron beam in the specimen, the region of generation of the backscattered electrons is widened to decrease the spatial resolution, but a signal representative of the backscattered electrons features containing a large amount of composition information in addition to a topographic state of the specimen surface and therefore in the conventional method, backscattered electrons of high energy are detected to mainly obtain information on composition in a specimen.

Available as another conventional backscattered electron detecting method is a method in which a specimen is scanned with primary electrons at low acceleration and backscattered electrons are generated near the surface of the specimen to ensure that the backscattered electrons can be detected while preventing degradation of the spatial resolution as far as possible. The conventional method, however, lacks means for detecting secondary electrons and backscattered electrons, generated under the irradiation of primary electrons on the specimen, accurately in a separate fashion and a signal picked up as a backscattered electron signal is mixed with secondary electrons, eventually failing to be a backscattered electron detecting method having high resolution.

Contrary to this, in the apparatus of the present invention, electric and magnetic fields for separating trajectories of backscattered electrons and secondary electrons generated from a specimen is established on an optical system between an electron source and the specimen, and a backscattered electron detector for detecting the backscattered electrons is disposed on the trajectory of the generated backscattered electrons and a secondary electron detector for detecting the secondary electrons is disposed on the trajectory of the secondary electrons, whereby the backscattered electrons and the secondary electrons can be detected separately to permit formation of a specimen image due to only the backscattered electrons.

In the method of detecting backscattered electrons under irradiation of primary electrons according to the present invention, backscattered electrons and secondary electrons can be discriminated accurately from each other to permit formation of a specimen image by only backscattered electrons of low energy even when the accelerating voltage is lowered, that is, the energy state is lowered in contrast to the conventional backscattered electron generating method.

Accordingly, the primary electrons at the low accelerating voltage are allowed to penetrate into only a shallow depth in the specimen and backscattered electrons from the specimen are discharged from the shallow depth, with the result that a signal representative of the backscattered electrons contains more information on a topographic state of the specimen than on a composition of the specimen. Therefore, by detecting the backscattered electron signal under this condition, a specimen image comparable to that obtained through the conventional secondary electron scanning can be formed.

Even when a specimen such as an insulating material to be observed and is charged up negatively (charged up), secondary electrons being of low energy as described previously are also liable to be affected by charge-up in the specimen surface during the generation process of the secondary electrons to cause a secondary electron signal to fail to reflect information on topography of the specimen with high fidelity. But backscattered electrons at a higher energy level than the secondary electrons are immune to the influence of the charge-up and topographic information of the specimen can be obtained stably even with the specimen charged up. Therefore, with the method of detecting backscattered electrons under irradiation of primary electrons according to the present invention, information on the specimen surface can be detected accurately even when the surface is charged up as demonstrated by the image of the specimen opening nearby portion of FIG. 5C.

Further, in the apparatus of the present invention, backscattered electrons can be detected in essentiality irrespective of an energy state of the backscattered electrons and therefore, even when backscattered electrons at a high energy state are detected to examine the composition of a specimen, the backscattered electrons and secondary electrons can be detected clearly discriminatively to ensure that accurate composition analysis can be performed.

Then, with the scanning-electron microscope of the present invention, since a backscattered electron signal and a secondary electron signal can exclusively be detected separately or concurrently in synchronism with irradiation of primary electrons, only secondary electrons can be detected when only topographic information is observed at high resolution while a specimen not being charged, only backscattered electrons can be detected when only composition information is desired to be observed mainly or when topographic observation of a charged-up specimen is carried out and both the secondary electrons and the backscattered electrons can be detected when both the topographic information and the composition information are observed. Accordingly, the secondary electron signal and the backscattered electron signal can be detected or synthesized selectively in conformity with the intention and the state of the specimen, thereby ensuring availability to all applications.

Further, with the scanning electron microscope of the present invention, an image of a target specimen due to a backscattered electron signal and an image of the target specimen due to a secondary electron signal can be superimposed to construct information on a specimen image.

For example, while the FIG. 5B image of a target specimen due to a secondary electron signal can provide accurate specimen topographic information only at the side surface and bottom of a contact hole because the opening of the contact hole is charged up, a backscattered electron signal according to FIG. 5C can provide an accurate topographic information of the opening; and therefore, by superimposing the two specimen images, that is, by using the specimen image due to a secondary electron signal for the interior of the contact hole and the specimen image due to backscattered electrons for the exterior of the contact hole, information on the target specimen of the whole of the contact hole can be obtained.

Figure 6A:
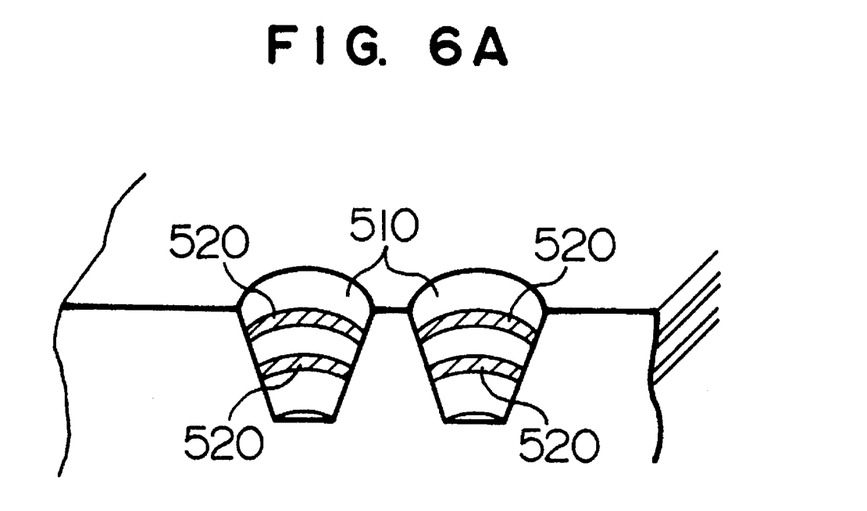
FIG. 6A is a diagram showing a schematic shape of another object to be measured.
Figure 6B:
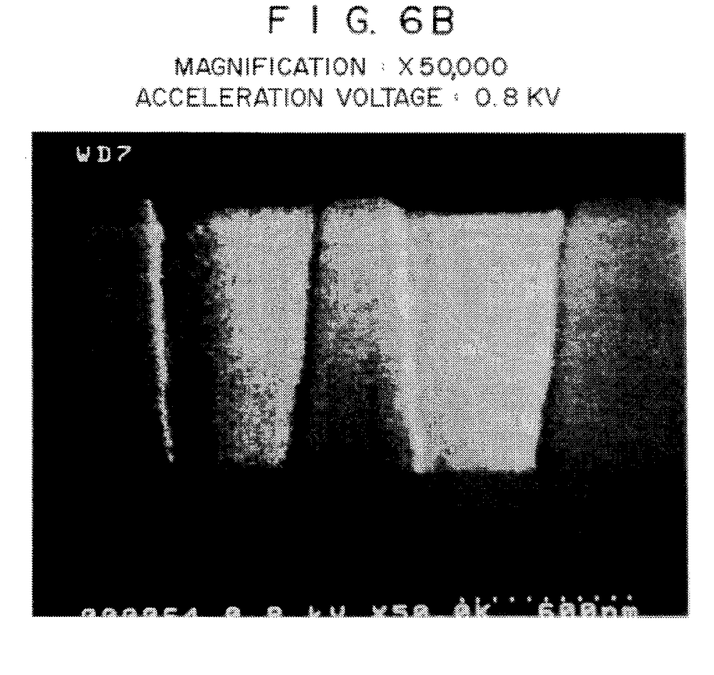
FIG. 6B shows an image obtained when the object is scanned with secondary electrons.
Figure 6C:
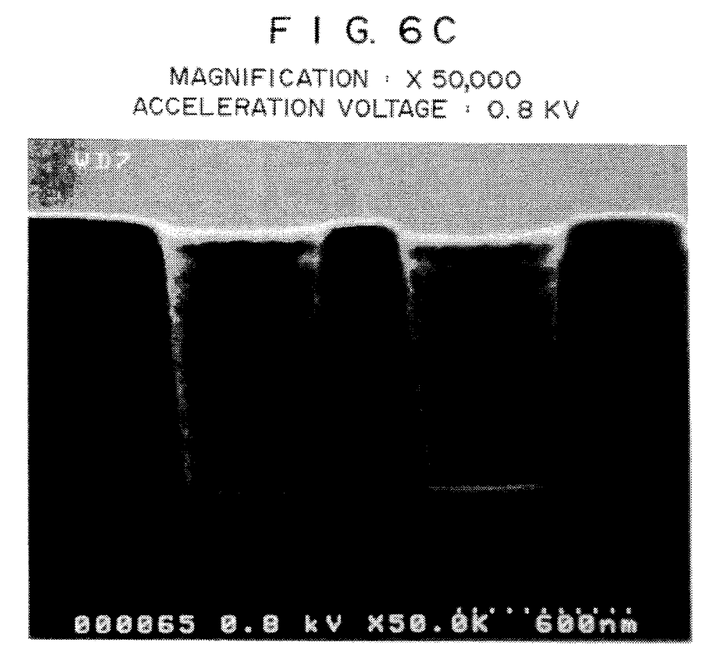
FIG. 6C shows an image obtained when the object is scanned with backscattered electrons.

FIG. 6A–6C show an embodiment in which a cross-section of contact holes 510 in a photoresist 512 formed on a semiconductor substrate (silicon oxide) is measured.

FIG. 6A shows a schematic shape of an object to be measured, indicating that stationary waves 520 generated during resist formation exist in the form of several formations in the photoresist formed on the semiconductor substrate (silicon oxide). It is to be noted that the photoresist 512 is not charged up.

FIG. 6B shows a specimen image constructed through the general method of detecting secondary electrons based on primary electron scanning from the direction of cross-section of the contact hole 510, indicating that a topographic state of the cross-sectional shape of the specimen can not be obtained due to the charging up of the specimen.

FIG. 6C shows a specimen image obtained through the method of detecting backscattered electrons based on primary electron scanning, wherein backscattered electrons from the specimen have an energy highly enough to avoid the influence of the charging up of the specimen and they are detected to indicate that stationary waves generated during the formation of resist in the photoresist exist in the form of several formations.

This is because the backscattered electrons are not likely to be affected by the influence of the charging up of the specimen in comparison with the secondary electrons such that the information with regard to the topographical state of the specimen is obtained.

Then, with the scanning electron microscope of the present invention, the backscattered electron signal and the secondary electron signal can be detected clearly separately at a time in synchronism with the primary electron irradiation and therefore both of topographic information and composition information of a specimen can be observed in a precise, comparative fashion.

Through this, both the topographic information and composition information can be obtained precisely by one irradiation of a primary electron beam on the specimen even when the specimen is, for example, fragile and surface information and composition information of the specimen are desired to be detected without irradiating an excessively large amount of electron beam and hence, damage to the specimen can be suppressed to a minimum as compared to the conventional method in which specimen surface information and composition information cannot be obtained unless the irradiation of a primary electron beam is carried out plural times, and availabilty to a wide range of specimen measuring application can be ensured.

Further, according to the scanning electron microscope of the present invention, an image of a target specimen due to a backscattered electron signal can be superimposed on an image of a target specimen due to a secondary electron signal to construct information on specimen image.

With the secondary electron signal of FIG. 6B of the present embodiment, accurate specimen surface information can be obtained and with the backscattered electron signal of FIG. 6C, information on a composition state of the resist can be obtained. Accordingly, by superimposing the two specimen images, for example, by processing brightness signals of one of the two pieces of information to reverse them and superimposing the reversed signals on the other brightness signals in the embodiment, a surface state and a composition state of the specimen can be displayed easily in a comparative fashion.

A method of processing signals for display may be employed in which, in addition to mere brightness adjustment of the respective pictures, predetermined color information can be added in accordance with the respective picture states to ensure that a surface state and a composition state of a specimen can easily be displayed in a comparative fashion.

Figure 7:
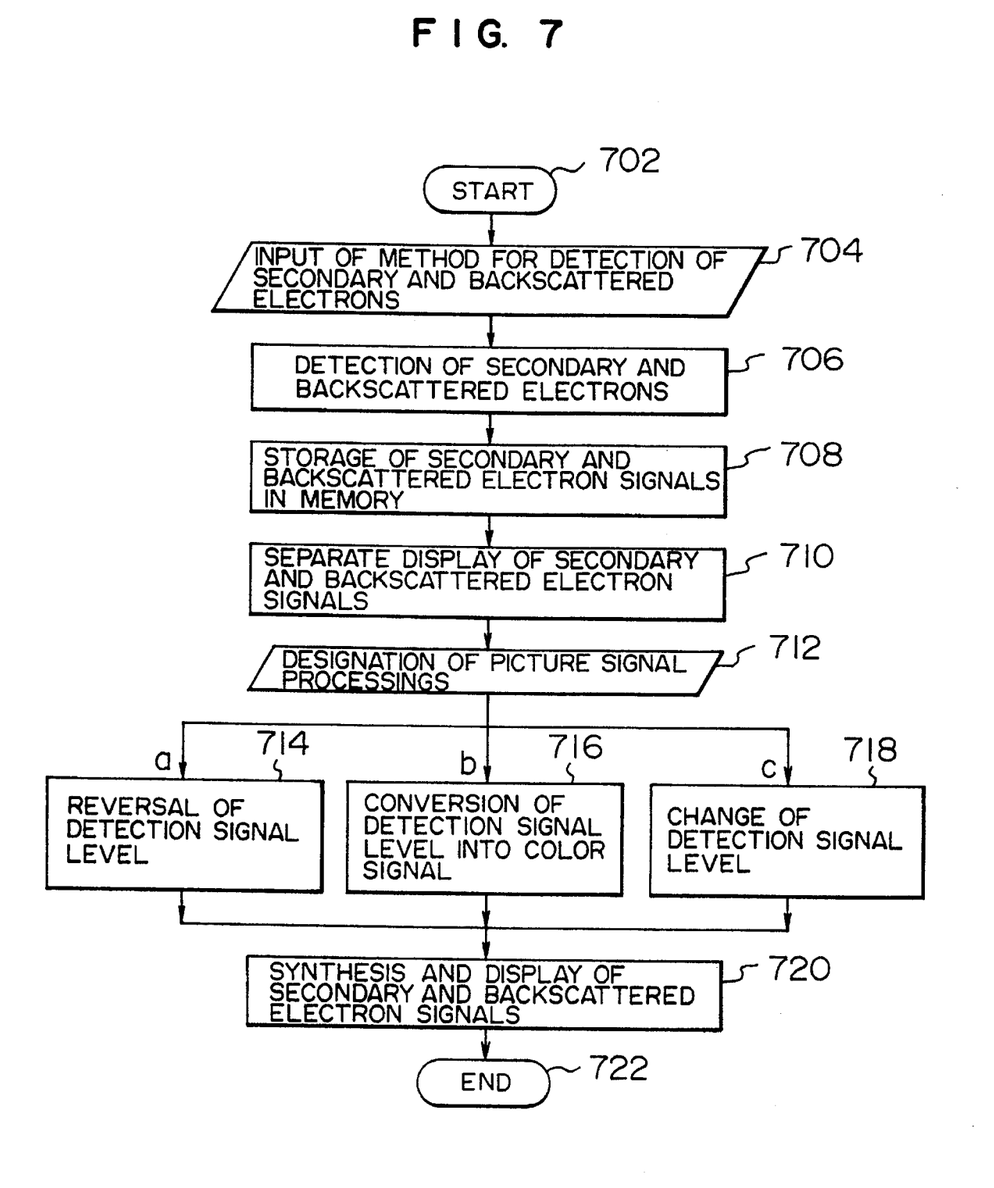
FIG. 7 is a flow chart for signal processings of analysis signals of an embodiment of the invention.

FIG. 7 is a flow chart showing the procedure of signal display processing of backscattered electrons and secondary electrons in an embodiment of the scanning electron microscope of the present invention.

The processing of a specimen image is started (step 702) and a method for detection of backscattered electrons and secondary electrons is inputted from the input unit 154 (step 704). Designated as the detection method at that time is a method of detecting backscattered electrons and secondary electrons at a time under one irradiation of a primary electron beam, a method of detecting only one of backscattered electrons and secondary electrons or an operation for detecting one of backscattered electrons and secondary electrons under one scanning of a primary electron beam and repeating this scanning plural times to obtain a specimen image.

Then, the backscattered electrons and secondary electrons are detected (step 706). A method of detecting the backscattered electrons and secondary electrons at a time or a method of detecting them separately is used as a method for this purpose in accordance with the designation in the aforementioned step 704.

Signals representative of the thus detected backscattered electrons and secondary electrons are stored in a memory of the storage means (step 708).

The stored backscattered and secondary electron signals are used to display independent specimen images due to the backscattered and secondary electron signals on the display unit 125 under the control of the CPU 150 (step 710).

While watching the pictures, the operator inputs designation of various kinds of image signal processings to the CPU 150 from the input unit 154 (step 712).

In processing a, the detection signal level of one of the backscattered and secondary electron signals is reversed (step 714). Through this, even when signal levels at portions desired to be analyzed and confirmed are high and a display obtained through synthesis of picture signals is collapsed, the difference between specimen pictures due to backscattered and secondary electrons can be displayed on the display unit 125.

In processing b, the detection signal level of one of backscattered and secondary electron signals or the detection signal levels of both signals are converted into color signals to be displayed on the display unit 125 and synthesized (step 716). Through this, portions of the same specimen which are represented by backscattered and secondary electron signals so as to differ delicately from each other can be displayed clearly distinctively in terms of a difference in color.

In processing c, the detection signal level of one of backscattered and secondary electron signals or the detection signal levels of both signals are converted and synthesized (step 718). Through this, different portions of the same specimen which are represented by backscattered and secondary electron signals so as to differ from each other can be displayed clearly distinctively in terms of an emphasized brightness signal.

The CPU 150 uses the backscattered and secondary electron signals having been subjected to the above signal processings to display a specimen image due to synthesized backscattered and secondary electron signals on the display unit 125, for example, the CRT (step 720).

While in the above signal processing the picture processing is carried out to show a processing for displaying a specimen image due to synthesis of backscattered and secondary electrons, specimen images of, for example, backscattered and secondary electrons can also be displayed independently on the display screen without being subjected to synthesis and signal processing or specimen images of backscattered and secondary electrons obtained after the signal processing can also be displayed independently, thereby informing the operator of a specimen state.

Effects brought about by the scanning electron microscope of the present invention will be described hereunder.

(1) According to the scanning electron microscope of the present invention, backscattered electrons generated under the irradiation of a primary electron beam at high to low acceleration can be detected, especially, secondary and backscattered electrons can be detected efficiently in a separate fashion even at a low accelerating voltage of several kilovolts or less and the detector does not exert the deflection action on the primary electron beam, so that backscattered and secondary electron images at high resolution can be obtained to advantage.

(2) Since backscattered electrons at low acceleration can be detected separately from secondary electrons, information on a specimen surface shape can be obtained by using backscattered electrons at the low acceleration even when a specimen is charged up and an accurate image cannot be obtained with secondary electrons.

(3) Unlike the conventional scanning electron microscope, the backscattered electron detector can be disposed on the side of the electron source as viewed from the objective lens and the distance between the objective lens and the specimen can be set as small as possible, with the result that a primary electron beam in the form of a maximally focused spot can be irradiated on the specimen and picture information due to backscattered and secondary electrons generated from the specimen can be of high resolution.

While in the conventional apparatus a specimen must be scanned with primary electrons plural times in order to obtain results of analysis of the specimen by backscattered and secondary electrons, the scanning electron microscope of the present invention can produce accurate backscattered and secondary electron signals through one scanning of primary electrons to ensure that even a specimen whose structure is liable to change under excessively repetitive irradiation of an electron beam can be analyzed without being damaged.

The present invention has been described in detail, it should be understood that various changes, substitutions and alterations can be made hereto without departing from the spirit and scope of the present invention as defined by the appended claims.

What is claimed is:

1. A scanning electron microscope for producing a scanning image of a specimen by scanning a primary electron beam emitted from an electron source on said specimen by converging with an objective lens, comprising:

electric and magnetic fields separating trajectories of backscattered electrons and secondary electrons generated from said specimen which are established between said electron source and said objective lens;

a backscattered electron detector detecting the backscattered electrons which is disposed on the trajectory of the backscattered electrons to detect backscattered electrons generated from said specimen; and a secondary electron detector detecting said secondary electrons, wherein the secondary electron detector is disposed on said trajectory of said separated secondary electrons.

2. A scanning electron microscope according to claim 1, wherein said backscattered electron detector is disposed at a site which deviates from a trajectory of the primary electron beam.

3. A scanning electron microscope according to claim 1, further comprising:

a porous electrode constructed of an electrode through which electrons can transmit;

an opposing electrode which opposes said porous electrode to generate the electric field, wherein said porous electrode and said opposing electrode are provided on a side of said electron source as viewed from said specimen; and a magnetic field generating coil capable of generating the magnetic field, wherein the magnetic field is orthogonal, on the optical axis, to the electric field generated by said porous electrode and opposing electrode, thereby establishing the electric and magnetic fields separating the trajectories of the backscattered and secondary electrons.

4. A scanning electron microscope according to claim 3, further comprising:

means for controlling the exciting current Ib of said magnetic field generating coil and the voltage ±Ve applied to said electrodes such that the relations $$Ib = K1 \cdot Kb \cdot \sqrt{Vacc}$$

$$Ve = K2 \cdot Ke \cdot Vacc$$

are maintained, where the potential difference between said porous electrode and opposing electrode is ±Ve (V), the exciting current of said magnetic field generating coil is Ib (A), the accelerating voltage for the primary electron beam is Vacc (V), constants determined by the shape of said porous electrode, opposing electrode and magnetic field generating coil are Ke and Kb, and for conditioning and setting the proportional constants K1 and K2 such that the electric and magnetic fields do not exert deflection action on the primary electron beam.

5. A scanning electron microscope according to claim 1, further comprising an electrode capable of converting the backscattered electrons into secondary electrons and disposed at a position viewing the trajectory of the backscattered electrons.

6. A scanning electron microscope according to claim 5, further comprising:

means capable of applying positive or negative voltage to said electrode capable of converting the backscattered electrons into secondary electrons.

7. A scanning electron microscope according to claim 6, further comprising:

an axis-symmetrical electrode which is disposed along the optical axis more closely to said specimen than said porous electrode and through which primary electrons can pass; and means capable of applying positive and negative voltages to said axis-symmetrical electrode.

8. A scanning electron microscope for producing a scanning image of a specimen by scanning a primary electron beam emitted from an electron source on said specimen, comprising:

electric and magnetic fields separating trajectories of backscattered electrons and secondary electrons from said specimen which are established between said electron source and said objective lens;

a backscattered electron detector detecting backscattered electrons generated from said specimen which is disposed on a trajectory of the backscattered electrons; and a secondary electron detector detecting said secondary electrons which is disposed on said trajectory of said separated secondary electrons;

wherein detected signals from said backscattered electron detector and said secondary electron detector are added to each other or subtracted from each other to construct an image of said specimen.

9. A scanning electron microscope according to claim 8, wherein signals from said bacscattered electron detector and said secondary electron detector are displayed in different colors.

10. A scanning electron microscope for producing a scanning image of a specimen by focusing a primary electron beam emitted from an electron source by means of an objective lens and scanning it on said specimen, comprising:

electric and magnetic fields for separating trajectories of backscattered electrons and secondary electrons generated from said specimen which are established between said specimen and electron source; and a backscattered electron detector for detecting the backscattered electrons which is disposed between said objective lens and electron source so that the distance between said specimen and said objective lens may be narrowed.

11. A scanning electron microscope according to claim 10, wherein said backscattered electron detector is disposed at a site which deviates from a trajectory of the primary electron beam.

12. A scanning electron microscope according to claim 10, further comprising a secondary electron detector detecting the secondary electrons which is disposed on the trajectory of the secondary electrons to detect secondary electrons generated from said specimen.

13. A scanning electron microscope according to claim 10, further comprising:

a porous electrode constructed of an electrode through which electrons can transmit;

an opposing electrode which opposes said porous electrode to generate the electric field, wherein said porous electrode and said opposing electrode are provided on a side of said electron source as viewed from said specimen; and a magnetic field generating coil capable of generating the magnetic field, wherein the magnetic field is orthogonal, on the optical axis, to the electric field generated by said porous electrode and opposing electrode, thereby establishing the electric and magnetic fields for separating the trajectories of the backscattered and secondary electrons.

14. A scanning electron microscope according to claim 13, further comprising:

means for controlling the exciting current Ib of said magnetic field generating coil and the voltage ±Ve applied to said electrodes such that the relations $$Ib = K1 \cdot Kb \cdot \sqrt{Vacc}$$

$$Ve = K2 \cdot Ke \cdot Vacc$$

are maintained, where the potential difference between said porous electrode and opposing electrode is ±Ve (V), the exciting current of said magnetic field generating coil is Ib (A), the accelerating voltage for the primary electron beam is Vacc (V), constants determined by the shape of said porous electrode, opposing electrode and magnetic field generating coil are Ke and Kb, and for conditioning and setting the proportional constants K1 and K2 such that the electric and magnetic fields do not exert deflection action on the primary electron beam.

15. A scanning electron microscope according to claim 10, further comprising an electrode capable of converting the backscattered electrons into secondary electrons and disposed at a position viewing the trajectory of the backscattered electrons.

16. A scanning electron microscope according to claim 15, further comprising:

means capable of applying positive or negative voltage to said electrode capable of converting the backscattered electrons into secondary electrons.

17. A scanning electron microscope according to claim 16, further comprising:

an axis-symmetrical electrode which is disposed along the optical axis more closely to said specimen than said porous electrode and through which primary electrons can pass; and means capable of applying positive and negative voltages to said axis-symmetrical electrode.

18. A scanning electron microscope according to claim 10, further comprising:

a secondary electron detector detecting the secondary electrons which is disposed on the trajectory of the secondary electrons, wherein signals from said backscattered electron detector and secondary electron detector are added to each other or subtracted from each other to construct said specimen image.

19. A scanning electron microscope according to claim 10, further comprising:

a secondary electron detector detecting the secondary electrons which is disposed on the trajectory of the secondary electrons, wherein signals from said backscattered electron detector and said secondary electron detector are displayed in different colors.

20. A scanning electron microscope for producing a scanning image of a specimen by scanning a primary electron beam emitted from an electron source on said specimen by converging with an objective lens, comprising:

electric and magnetic fields separating trajectories of backscattered electrons and secondary electrons generated from said specimen which are established between said electron source and said objective lens;

an electrode capable of converting the backscattered electrons into secondary electrons and disposed at a position viewing the trajectory of the backscattered electrons;

a secondary electron detector detecting the secondary electrons connected from the backscattered electrons at the electrode; and means capable of applying positive or negative voltage to said electrode capable of converting the backscattered electrons into secondary electrons.

21. A scanning electron microscope according to claim 20, further comprising:

an axis-symmetrical electrode which is disposed along the optical axis more closely to said specimen than said porous electrode and through which primary electrons can pass; and means capable of applying positive and negative voltages to said axis-symmetrical electrode.

22. A scanning electron microscope for producing a scanning image of a specimen by scanning a primary electron beam emitted from an electron source on said specimen by converging with an objective lens, comprising:

electric and magnetic fields separating trajectories of backscattered electrons and secondary electrons generated from said specimen which are established between said electron source and said objective lens;

a backscattered electron detector detecting the backscattered electrons which is disposed on the trajectory of the backscattered electrons to detect backscattered electrons generated from said specimen;

a porous electrode constructed of an electrode through which electrons can transmit;

an opposing electrode which opposes said porous electrode to generate the electric field, wherein said porous electrode and said opposing electrode are provided on a side of said electron source as viewed from said specimen;

a magnetic field generating coil capable of generating the magnetic field, wherein the magnetic field is orthogonal, on the optical axis, to the electric field generated by said porous electrode and opposing electrode, thereby establishing the electric and magnetic fields separating the trajectories of the backscattered and secondary electrons; and means for controlling the exciting current Ib of said magnetic field generating coil and the voltage +Ve applied to said electrodes such that the relations $$Ib = K1 \cdot Kb \cdot \sqrt{Vacc}$$

$$Ve = K2 \cdot Ke \cdot Vacc$$

are maintained, where the potential difference between said porous electrode and opposing electrode is ±Ve (V), the exciting current of said magnetic field generating coil is Ib (A), the accelerating voltage for the primary electron beam is Vacc (V), constants determined by the shape of said porous electrode, opposing electrode and magnetic field generating coil are Ke and Kb, and for conditioning and setting the proportional constants K1 and K2 such that the electric and magnetic fields do not exert deflection action on the primary electron beam.

* * * * *